United States Patent
Matsuno et al.

(10) Patent No.: US 8,592,978 B2
(45) Date of Patent: Nov. 26, 2013

(54) METHOD OF FABRICATING SEMICONDUCTOR DEVICE AND THE SEMICONDUCTOR DEVICE

(75) Inventors: Koichi Matsuno, Mie-gun (JP); Yoshiaki Himeno, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 359 days.

(21) Appl. No.: 12/729,804

(22) Filed: Mar. 23, 2010

(65) Prior Publication Data

US 2010/0244257 A1    Sep. 30, 2010

(30) Foreign Application Priority Data

Mar. 30, 2009   (JP) ................................. 2009-082060

(51) Int. Cl.
- H01L 23/48 (2006.01)
- H01L 23/52 (2006.01)
- H01L 29/40 (2006.01)

(52) U.S. Cl.
USPC ............ 257/751; 257/774; 257/758; 257/776

(58) Field of Classification Search
USPC .......... 257/751, 774, 758, 759, 760, 775, 776
See application file for complete search history.

(56) References Cited

U.S. PATENT DOCUMENTS

| | | | | |
|---|---|---|---|---|
| 6,071,789 A | * | 6/2000 | Yang et al. | 438/396 |
| 6,297,084 B1 | * | 10/2001 | Joung et al. | 438/238 |
| 7,192,862 B2 | * | 3/2007 | Mitani | 438/629 |
| 7,642,652 B2 | * | 1/2010 | Saito et al. | 257/758 |
| 7,648,919 B2 | * | 1/2010 | Tran et al. | 438/738 |
| 2002/0127810 A1 | * | 9/2002 | Nakamura | 438/296 |
| 2007/0231995 A1 | * | 10/2007 | Hanson et al. | 438/243 |

FOREIGN PATENT DOCUMENTS

| | | |
|---|---|---|
| JP | 2007-43156 | 2/2007 |
| JP | 2008-103719 | 5/2008 |
| JP | 2008-103729 | 5/2008 |
| JP | 2009-65093 | 3/2009 |

OTHER PUBLICATIONS

Notification of Reasons for Refusal issued on Aug. 30, 2011 in the corresponding Japanese Patent Application No. 2009-082060 (with English Translation).

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

A semiconductor device includes a semiconductor substrate, an insulating film formed above the semiconductor substrate, and a plurality of first buried wirings and a plurality of second buried wirings located in the insulating film at predetermined intervals alternately in a direction parallel to a surface of the semiconductor substrate. Each second buried wiring is formed so that a width between both side surfaces thereof is increased from a lower end toward an upper portion and at an upper surface the width is larger than a width at an upper surface of each first buried wiring.

13 Claims, 7 Drawing Sheets

METHOD OF FABRICATING SEMICONDUCTOR DEVICE AND THE SEMICONDUCTOR DEVICE

CROSS-REFERENCE TO RELATED APPLICATIONS

This application is based on and claims the benefit of priority from the prior Japanese Patent Application No. 2009-82060, filed on Mar. 30, 2009, the entire contents of which are incorporated herein by reference.

BACKGROUND

1. Field

The present invention relates to a method of fabricating a semiconductor device provided with a microscopic wiring pattern and the semiconductor device.

2. Related Art

A photolithography technique as one of semiconductor processing techniques includes a sidewall transfer process which provides a microscopic wiring pattern exceeding a limit of minimum patterning width of a resist film. For example, Japanese patent application publication, JP-A-2007-43156 discloses the following process through which a semiconductor device is fabricated. Firstly, a resist is patterned by an ordinary lithography technique, and a first film is etched so that core-forming patterns are formed at a predetermined pitch on a film to be processed. Next, a second film is formed along upper surfaces and side surfaces of the core-forming patterns and an exposed upper surface of the film to be processed, so as to have a predetermined film thickness. The second film is formed into the shape of a spacer so that the upper surfaces of the first film and film to be processed are exposed. Thereafter, the core-forming patterns are removed. As a result, a mask pattern of the spacer-shaped second film is obtained. The aforesaid film to be processed is processed using the obtained mask pattern of the second film, whereupon a microscopic wiring pattern can be formed.

In the above-described processing, the mask pattern formed by the above-described second film is spacer-shaped. Accordingly, side surfaces of the mask pattern facing the core-forming pattern are formed into a generally vertical shape, whereas side surfaces of the mask pattern located opposite the core-forming pattern has a generally rounded upper surface. The mask pattern accordingly has an unsymmetric section. When the mask pattern thus formed is used as a mask for the film to be processed, the unsymmetric shape of the mask pattern is transferred to the film to be processed. This results in a problem of a difference in the shape of the processed film.

SUMMARY

According to one aspect of the present invention, there is provided a method of fabricating a semiconductor device, comprising forming an insulating film and a core-forming film above a semiconductor substrate in turn; processing the core-forming film into a plurality of core patterns; forming a mask-forming film with a predetermined film thickness along upper surfaces and side surfaces of the core patterns and portions of an upper surface of the insulating film exposed between the adjacent core patterns; forming a plurality of mask patterns by anisotropically etching the mask-forming film until the upper surfaces of the core patterns are exposed; removing the core patterns with respective upper surfaces being exposed; forming a plurality of wiring groove patterns by etching the insulating film with the mask patterns serving as masks after the core pattern has been removed; and forming a plurality of buried wirings by burying an electrically conductive film in the wiring groove patterns, wherein in forming the mask patterns, a facing pair includes a pair of the mask patterns facing the core pattern located between the paired mask patterns, the mask patterns of the facing pair having respective lower portions spaced from each other by a first distance; an adjacent pair includes a pair of the mask patterns adjacent to each other with a space having no core pattern, the mask patterns of the adjacent pair having respective lower portions spaced from each other by a second distance; and the mask patterns are formed so that the second distance is larger than the first distance.

According to another aspect of the invention, there is provided a semiconductor device comprising a semiconductor substrate; an insulating film formed above the semiconductor substrate; and a plurality of first buried wirings and a plurality of second buried wirings provided in the insulating film at predetermined intervals alternately in a direction parallel to a surface of the semiconductor substrate, wherein each second buried wiring is formed so that a width between both side surfaces thereof is increased from a lower end thereof toward an upper portion thereof and at an upper surface thereof the width is larger than a width at an upper surface of each first buried wiring.

DETAILED DESCRIPTION

One embodiment will be described with reference to FIGS. 1 to 11. The embodiment is directed to a NAND flash memory. Identical or similar parts are labeled by the same reference symbols throughout the figures, which are schematic and differ in the actual relationship between a thickness and a planar dimension, a ratio among thicknesses of layers and the like.

Figure 1:
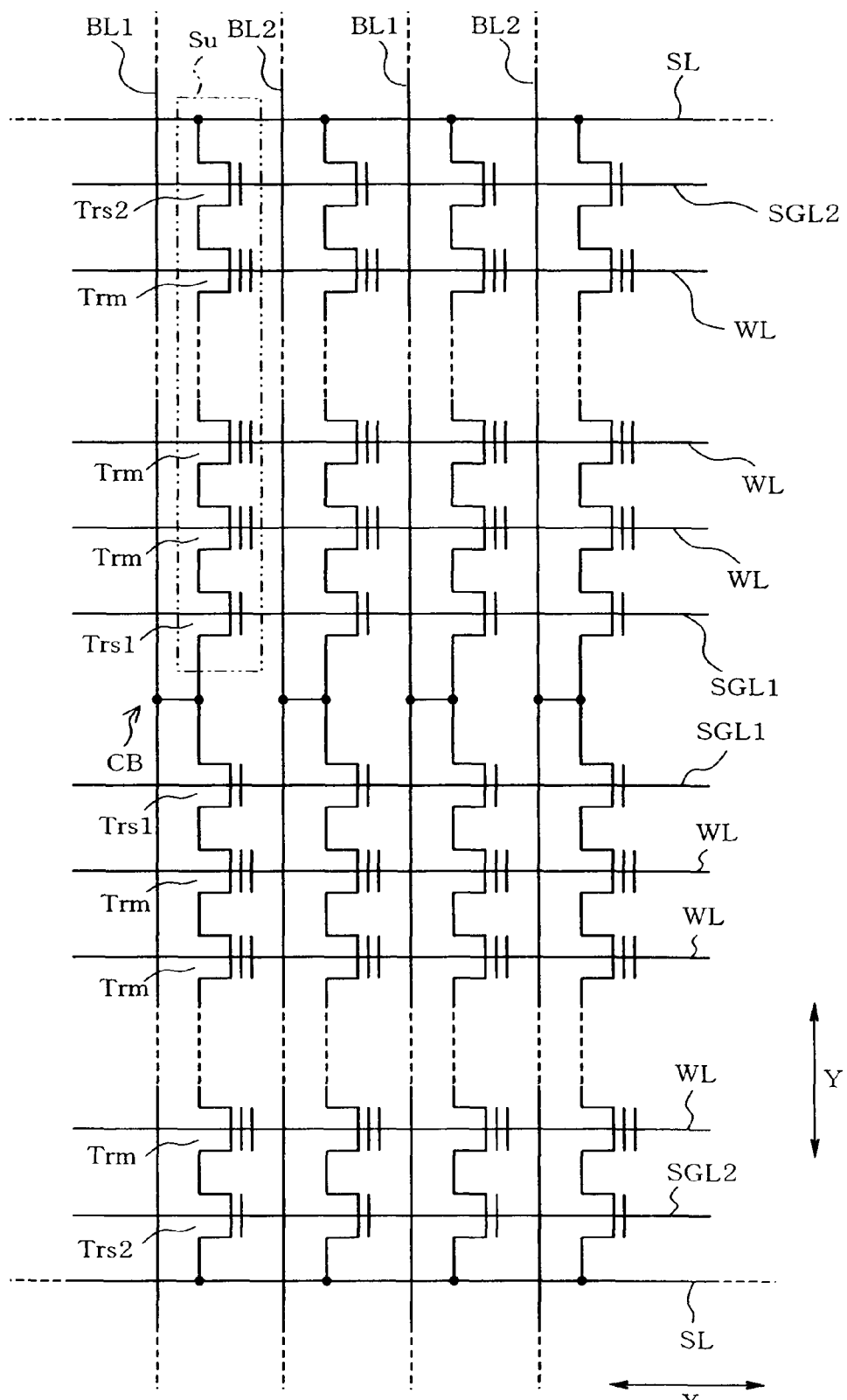
FIG. 1 schematically illustrates an electrical arrangement of a part of a memory cell region of a NAND flash memory in accordance with one embodiment of the present invention.

Firstly, the configuration of the NAND flash memory will be described. FIG. 1 is an equivalent circuit diagram showing a part of memory cell array formed in a memory cell region of the NAND flash memory. The memory cell array is composed of NAND cell units (memory units) Su arranged in a matrix. Each NAND cell unit includes two selective gate transistors Trs1 and Trs2 and a plurality of memory cell transistors Trm ($2^n$ where n is a positive number, 8, for example) series-connected between the selective gate transistors Trs1 and Trs2. In the NAND cell units Su, the memory cell transistors Trm adjacent to each other are arranged to share a single source/drain region.

The memory cell transistors Trm constituting each row and arranged in the X direction in FIG. 1 (the direction of word line or the direction of gate width) are commonly connected to a word line WL (a control gate line). Furthermore, the selective gate transistors Trs1 constituting each row and arranged in the X direction in FIG. 1 are commonly connected to a selective gate line SGL1. The selective gate transistors Trs2 constituting each row are also commonly connected to a selective gate line SGL2. Each selective gate transistor Trs1 has a drain region to which a bit line contact CB is connected. Each bit line contact CB is connected to a bit line BL1 or BL2 extending in the Y direction perpendicular to the X direction in FIG. 1. The selective gate transistors Trs2 are connected via source regions to source lines SL extending in the X direction in FIG. 1.

Figure 2:
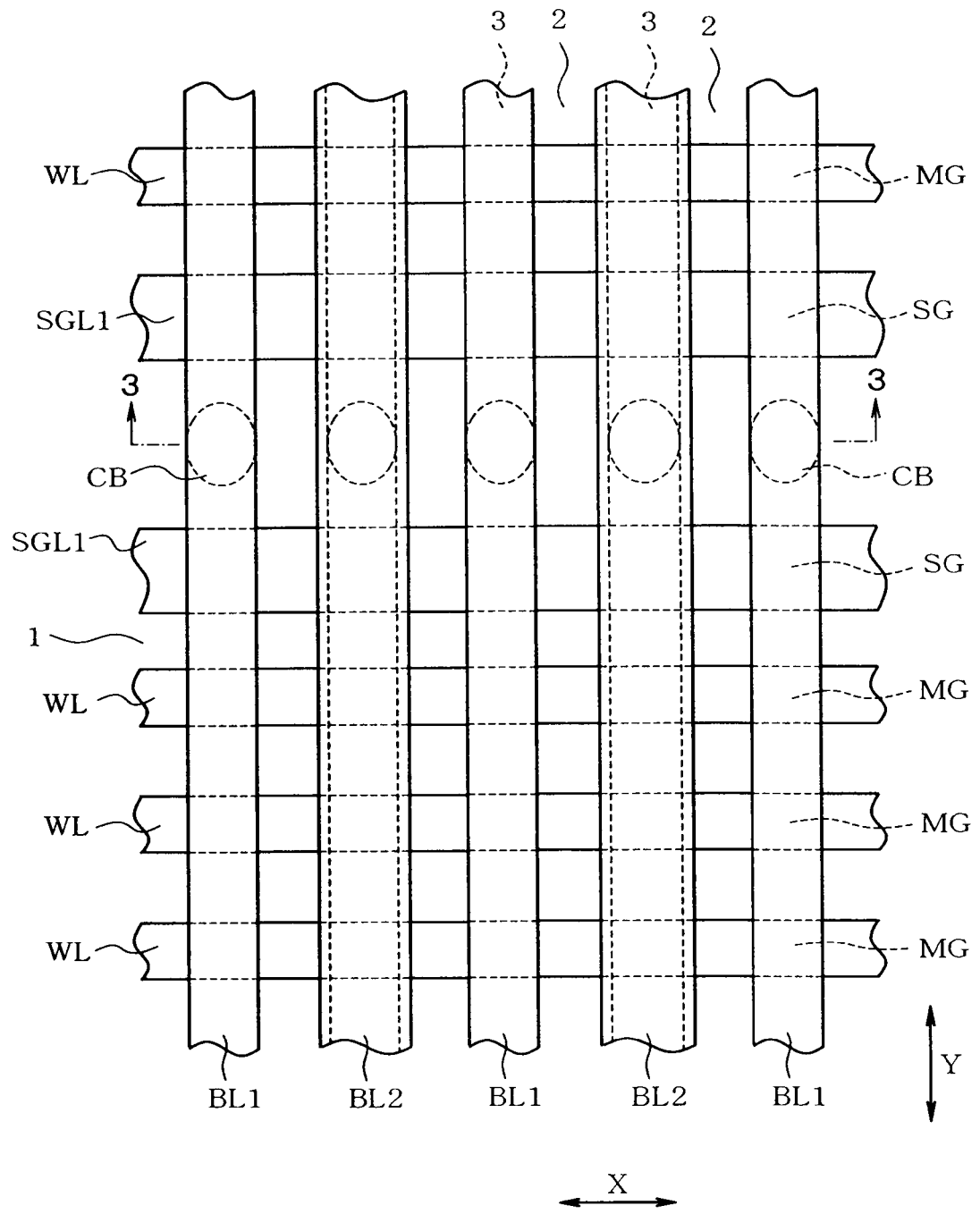
FIG. 2 is a schematic plan view showing the structure of a part of the memory cell region.

FIG. 2 is a plan view showing a layout pattern of a part of the memory cell region. A plurality of element isolation insulating films 2 is formed on a silicon substrate 1 serving as a semiconductor substrate so as to have a shallow trench isolation (STI) structure and to extend in the Y direction in FIG. 2. The element isolation insulating films 2 are spaced from each other in the X direction, whereupon a surface layer of the silicon substrate 1 is divided into a plurality of active regions 3 (element formation regions). A plurality of word lines WL is formed so as to extend in the X direction perpendicular to the active regions 3. The word lines WL are spaced from one another in the Y direction in FIG. 2.

A pair of selective gate lines SGL1 are formed so as to extend in the X direction. Bit line contacts CB are formed in the active regions 3 between the selective gate lines SGL1. Gate electrodes MG of the memory cell transistors Trm are formed on portions of the active region 3 intersecting the word lines WL respectively. Gate electrodes SG of the selective gate transistors Trs1 are formed on portions of the active region 3 intersecting the selective gate lines SGL1 respectively. A plurality of bit lines BL1 and a plurality of bit lines BL2 are alternately formed on upper portions of the bit line contacts CB so as to overlap the active region 3. Each bit line BL1 has a width that is substantially the same as a diameter of each bit line contact CB, and each bit line BL2 includes an upper surface having a width that is larger than the diameter of each bit line contact CB.

Figure 3:
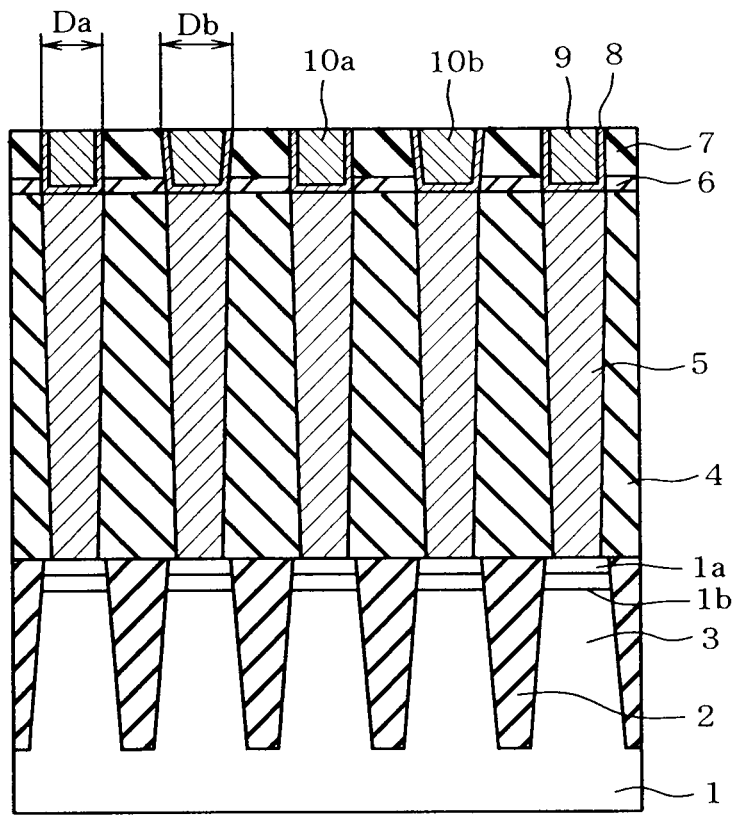
FIG. 3 is a schematic view taken along line 3-3 in FIG. 2.

FIG. 3 is a section taken along line 3-3 in FIG. 2 or more specifically, along the array direction of the bit line contacts CB (along the X direction in FIG. 2), showing the section of the drain region common to the paired selective gate transistors Trs1 and Trs1. The silicon substrate 1 is divided by element isolation insulating films 2 formed at predetermined intervals into a plurality of active regions 3. The active regions 3 have surface layers where low-density and high-density impurity diffusion regions 1a and 1b are formed as drain regions of a lightly doped drain (LDD) structure. The low-density and high-density diffusion regions have different depths. A silicon oxide film 4 serving as an interlayer insulating film is formed on the upper surface of the silicon substrate 1 so as to cover gate electrodes of the memory cell transistors Trm and selective gate transistors Trs1 and Trs2 or peripheral circuit transistors (not shown) etc.

A plurality of contact plugs 5 serving as the bit line contacts CB is formed so as to extend vertically through the silicon oxide film 4 respectively. Each contact plug 5 is made of an electrically conductive material such as a tungsten (W) film and has a lower end which is in contact with the upper surfaces of the active regions 3 of the silicon substrate 1 thereby to form an ohmic contact. The silicon oxide film 4 and the contact plugs 5 have respective flat upper surfaces. A silicon nitride film 6 serving as a stopper film is formed on the upper surface of the silicon oxide film 4. A silicon oxide film 7 serving as a filling insulating film is deposited on an upper surface of the silicon nitride film 6. The silicon oxide film 7 may be, for example, a tetraethoxysilane (TEOS) oxide film made by a plasma chemical vapor deposition (CVD) method.

The silicon nitride film 6 and silicon oxide film 7 are formed with a wiring groove pattern corresponding to the locations of the contact plugs 5. Conductor films comprising a barrier metal layer 8 and a copper (Cu) layer 9 are buried in the pattern thereby to be formed into first and second buried wirings 10a and 10b. The barrier metal layer 8 has a stacked structure of titanium/titanium nitride (Ti/TiN) and is formed thin along an inner surface of the wiring groove pattern. The first and second wirings 10a and 10b are formed so as to correspond to the bit lines BL1 and BL2 which are disposed cyclically and alternately, respectively.

The first buried wiring 10a has substantially the same width Da from a bottom to an upper surface thereof, which width Da is substantially equal to the width of the upper surface of the contact plug 5. The first buried wiring 10a is formed into a generally rectangular section. The second buried wiring 10b has a bottom further having a width that is substantially the same as the width Da of the first buried wiring 10a. The second buried wiring 10b has an upper surface with a width Db that is larger than the width Da. Thus, the width of the second buried wiring 10b is rendered larger as both side surfaces thereof go upward, whereupon the second buried wiring 10b has a trapezoidal section with both side surfaces being tapered.

According to the above-described configuration, the second buried wiring 10b is formed so that the upper portion thereof has a larger wiring width than the first buried wiring 10a and the lower portion thereof has substantially the same wiring width as the first buried wiring 10a. As a result, the second buried wiring 10b has a slightly larger sectional area with respect to the direction in which the current flows than the first buried wiring 10a and accordingly a slightly smaller wiring resistance than the second buried wiring 10b.

The second buried wiring 10b may have at the bottom a width smaller than the width Da and at the upper surface a width larger than the width Da. As a result, the first and second buried wirings 10a and 10b have substantially the same sectional area, whereupon the first and second buried wirings 10a and 10b can be formed so as to have substantially the same wiring resistance.

Figure 4:
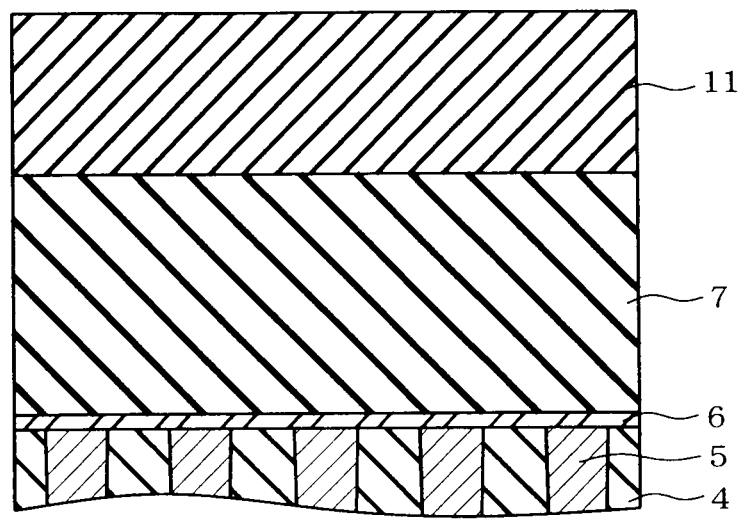
FIGS. 4 to 11 are views similar to FIG. 3, showing sequential steps of the fabrication process respectively.

A fabrication process of the foregoing configuration will now be described with reference to FIGS. 4 to 11 as well as FIGS. 1 to 3. FIG. 4 is a schematic section taken along the same line as applied to FIG. 3, showing a step in the fabrication process. In FIGS. 4 to 11, part of the structure in which the first and second buried wirings 10a and 10b are formed is shown and another part related to the silicon substrate 1 is eliminated.

Firstly, the silicon nitride film 6 serving as the stopper film is formed on the silicon oxide film 4 and the contact plugs 5 by the plasma CVD method so as to have a film thickness of about 30 nm, as shown in FIG. 4. The silicon oxide film 7 serving as an insulating film is subsequently formed on an upper surface of the silicon nitride film 6 by the plasma CVD method so as to have a film thickness of about 100 nm. A silicon nitride film 11 serving as a core material film (core-forming film) is formed on an upper surface of the silicon oxide film 7 by the plasma CVD method so as to have a film thickness of about 150 nm.

Figure 5:
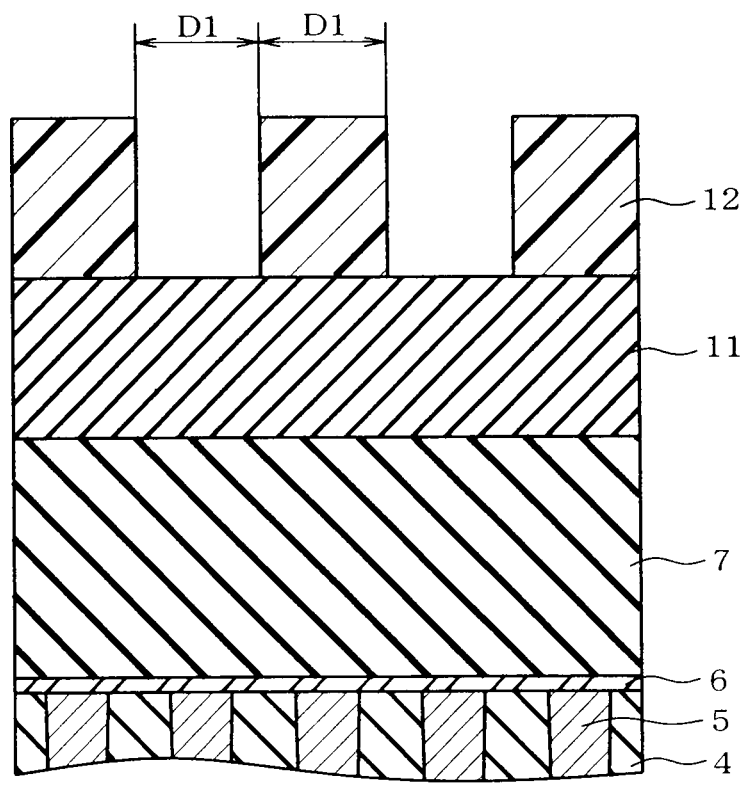
Figure 6:
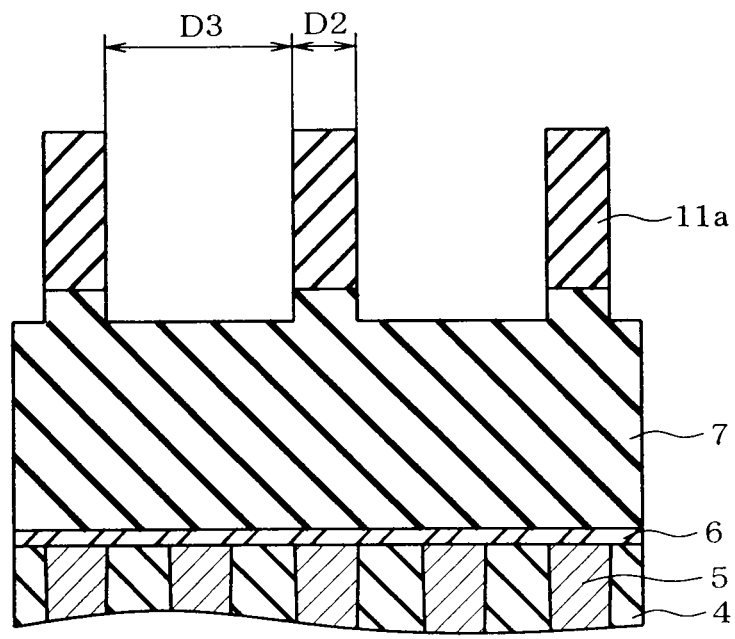

Subsequently, a resist pattern 12 is formed by a photolithography technique so as to have a line-and-space (L/S) pattern having a width that is twice as large as a width of L/S pattern to be finally formed, as shown in FIG. 5. The resist pattern 12 and the interline space of the L/S pattern have the same width D1 (64 nm, for example). Subsequently, the silicon nitride film 11 is etched by a dry etching process with the resist pattern 12 serving as a mask, and a slimming process is carried out so that core patterns 11a are formed, as shown in FIG. 6. In the slimming process, the patterned silicon nitride film 11 is isotropically etched so that a lateral dimension or a width of the silicon nitride film 11 is reduced to about half. As a result, the core pattern 11a has a width D2 (about 32 nm, for example) that is smaller than the width D1 of the resist pattern 12, and the space between the adjacent core patterns 11a has a dimension D3 (about 96 nm, for example) that is larger than the dimension D1. The space D3 is about three times larger than the width D2 of the core pattern 11a. With the etching of the core pattern 11a, an exposed part of the silicon oxide film 7 which is a base of the core pattern 11a is dug so that an exposed portion thereof is located slightly lower than the bottom of the core pattern 11a.

Figure 7:
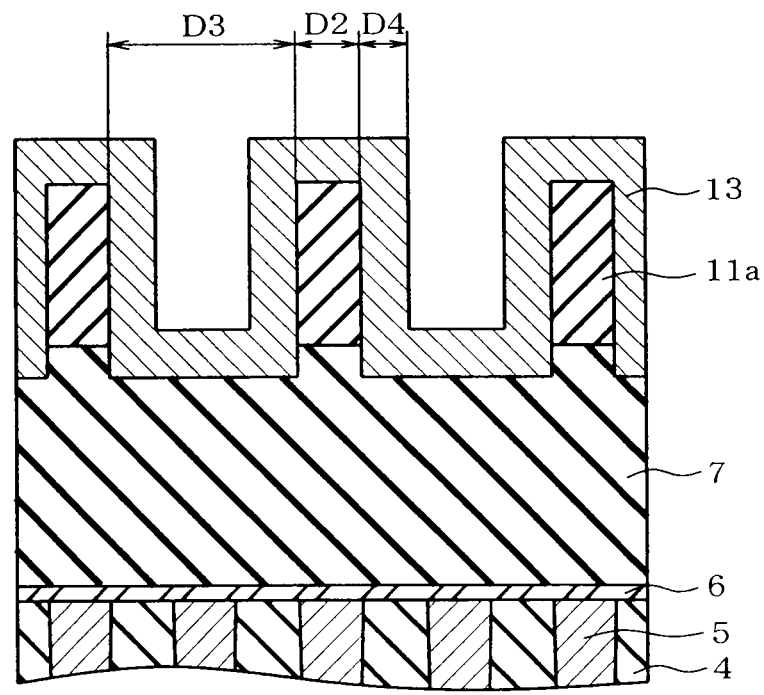

Subsequently, as shown in FIG. 7, an amorphous silicon film 13 having a film thickness slightly smaller than the width D2 of the core pattern 11a (about 29 nm, for example) is formed by a low pressure chemical vapor deposition (LPCVD) method into a liner film extending along the upper surfaces and side surfaces of the core patterns 11a and the upper surfaces of the silicon oxide film 7 exposed between the adjacent core patterns 11a.

Figure 8:
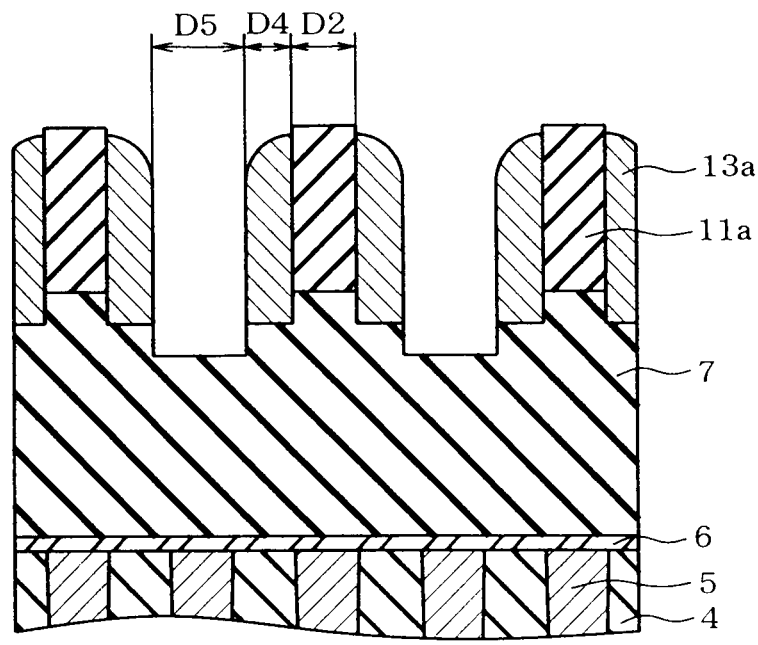

Subsequently, the amorphous silicon film 13 is formed by a dry etching process (a reactive ion etching (RIE)) into a spacer shape as shown in FIG. 8. As a result, a pair of mask patterns 13a are formed on both side surfaces of the core patterns 11a respectively. The paired mask patterns 13a, which will hereinafter be referred to as "facing pair," face the core pattern 11a, and a dimension between lower ends of the patterns 13a of the facing pair is the same as the width D2 of the core pattern 11a. On the other hand, another pair of mask patterns 13a, which will hereinafter be referred to as "adjacent pair," are adjacent to each other with no core pattern 11a, and a dimension D5 between lower ends of the patterns 13a of the adjacent pair is larger than width D2. Each mask pattern 13a has a width that is substantially the same as film thickness D4 throughout the elongation thereof. Each mask pattern 13a has a rounded upper end of the side located opposed to the side thereof facing the core pattern 11a.

Figure 9:
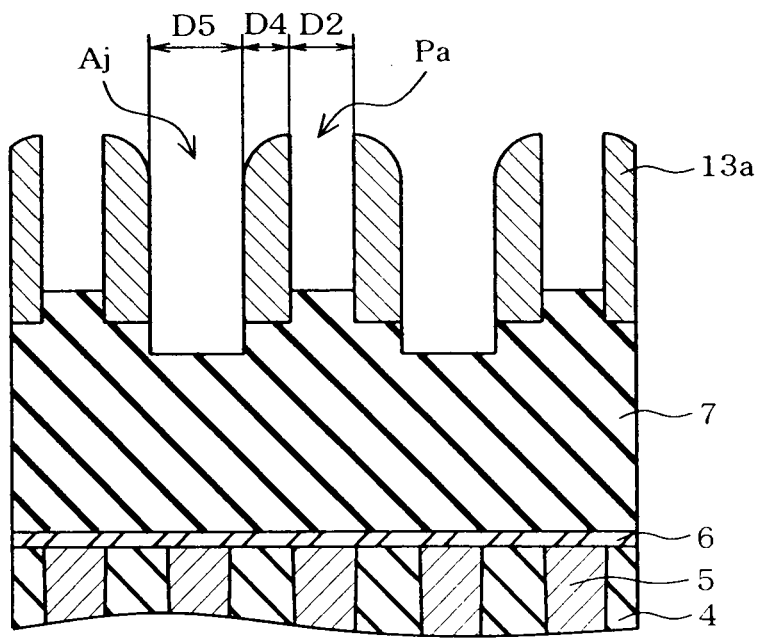

Subsequently, the core patterns 11a each comprising the silicon nitride film is removed using a peeling liquid such as phosphoric acid as shown in FIG. 9, whereupon independent mask patterns 13a are formed. In this state, the mask patterns 13a are formed at predetermined intervals periodically. Vertical side surfaces (having substantial zero inclination angles) of the mask patterns 13a of each facing pair Pa face each other, while the vertical or inclined side surfaces of the mask patterns 13a of each adjacent pair Aj have respective rounded upper ends and face each other.

Each facing pair Pa with the vertical side surfaces have the inter-pattern dimension that is substantially the same as D2 throughout elongation thereof. Each adjacent pair Aj have the dimension D5 between the lower ends thereof, which dimension is slightly larger than D2, and the upper ends which are further spread.

Figure 10:
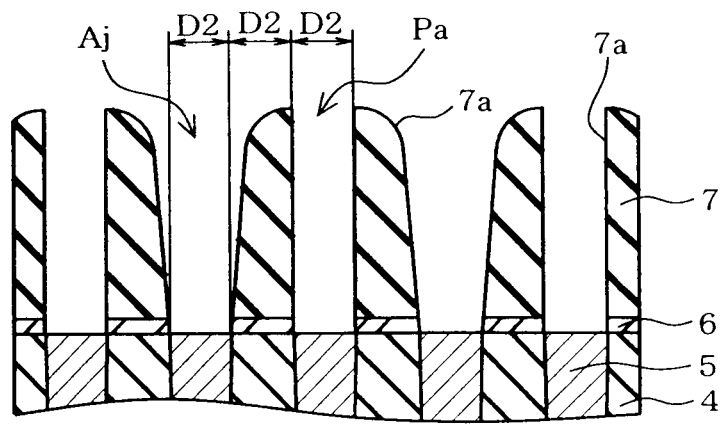

Subsequently, wiring grooves are formed in the silicon oxide film 7 and the silicon nitride film 6 by the dry etching process such as RIE as shown in FIG. 10. In this case, an etching condition is determined so that by-products resulting from the etching easily adhere to sidewalls. As a result, upon start of the etching, a larger amount of by-products adheres to the sidewalls at the adjacent pair Aj side of the silicon oxide film 7 since the opening is spread. Accordingly, with progress in the etching process, the groove width is reduced in each adjacent pair Aj where an amount of deposition is larger. Upper ends of wall surfaces (groove side surfaces) of the silicon oxide film 7 are rounded in the same manner as the upper ends of the mask patterns 13a, while the wall surfaces of the silicon oxide film 7 are inclined as compared with the mask patterns 13a of the adjacent pair Aj thereby to be formed into tapered surfaces.

Thus, the silicon oxide film 7 is etched at each facing pair Pa so as to have substantially vertical surfaces, whereas the silicon oxide film 7 is etched at each adjacent pair Aj so as to have tapered surfaces reaching the lower ends, whereupon the wiring groove patterns 7a are formed. As the result of the forming of the tapered surfaces in the wiring groove patterns 7a, the width of each silicon oxide film 7 is slightly increased near the lower end thereof while the width of the wiring groove portions 7a of each adjacent pair Aj is reduced toward the lower end. Consequently, the groove width of each facing pair Pa, the groove width in each adjacent pair Aj and the width of each silicon oxide film 7 at the lower ends are rendered substantially equal to D2.

Figure 11:
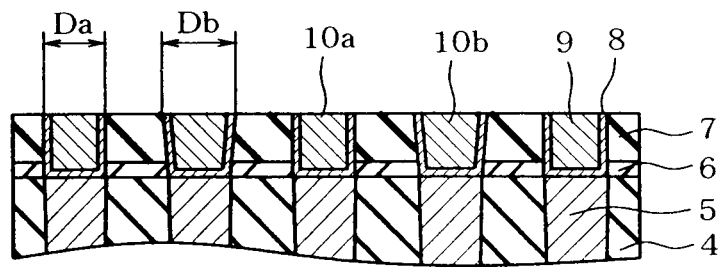

Subsequently, the barrier metal layer 8 is formed in the wiring groove patterns 7a by sputtering as shown in FIG. 11. The barrier metal layer 8 comprises a stacked film of titanium/titanium nitride (Ti/TiN), and the copper (Cu) layer 9 is further formed by plating. Thereafter, a planarization process is executed by a chemical mechanical polishing (CMP) method so that the configuration as shown in FIG. 11 is obtained. In the planarization process by the CMP method, the copper layer 9 and barrier metal layer 8 are polished until reach of respective predetermined heights so that at least rounded upper portions of the silicon oxide film 7 are removed.

As a result, the first buried wirings 10a are formed in the respective facing pairs Pa, and the second buried wirings 10b are formed in the respective adjacent pairs Aj. Since the first buried wirings 10a are formed in the respective facing pairs Pa, the widths of each wiring 10a at the upper surface thereof and at the lower end thereof are substantially the same, as shown by reference symbol "Da" in FIG. 11. Since the second buried wirings 10b are formed in the respective adjacent pairs Aj and the wiring groove patterns 7a have the tapered surfaces, the width of each wiring 10b is wider at the upper surface thereof as shown by reference symbol "Db" and is substantially the same as dimension Da at the lower end.

The above-described configuration can achieve the following advantages. The wiring groove patterns 7a used in the forming of fine L/S patterns by a sidewall transfer technique are configured so that the groove width of each adjacent pair Aj at the upper portion thereof is larger than the groove width of each facing pair Pa at the upper portion thereof. Accordingly, even when an overhang is formed on the rounded portion or the like during the forming of the barrier metal layer 8 by a sputter method, the above-described configuration can suppress adverse effect on the subsequent forming of the copper layer 9. Thus, the buriability into the adjacent pairs Aj can be improved when the copper layer 9 is formed by plating or the like. In this respect, when the width of the wiring groove pattern in each adjacent pair Aj is small so that the aforesaid overhang occurs during the forming of a barrier metal layer, an effective width is reduced such that there is a possibility of malfunction in burying such as occurrence of void in the adjacent pair Aj during the plating of copper layer. However, the above-described configuration can suppress the occurrence of malfunction as much as possible.

In addition to the foregoing advantage, the wiring groove patterns 7a are formed so that the width is increased at the upper ends of each adjacent pair Aj and the width is substantially the same at the lower ends of each adjacent pair Aj as the width D2 in each facing pair Pa. Accordingly, contact areas of the first and second buried wirings 10a and 10b with the respective contact plug 5 are substantially equal to each other when the buried wirings 10a and 10b are formed. Consequently, the variations in the contact resistance can be suppressed. This can also suppress variations in the contact resistance even upon occurrence of mask misalignment in a lithography process. Furthermore, since insulation distances between the first and second buried wirings 10a and 10b and the respective adjacent contact plugs 5 are also substantially equal to each other, the process capacity can be prevented from being reduced.

Figure 12:
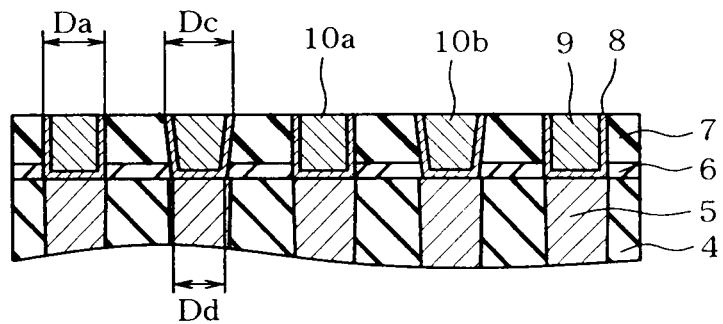
FIG. 12 is a view similar to FIG. 11, showing a modified form.

Each second buried wiring 10b may be formed so that the width thereof at the upper surface is set at Dc larger than Da and the width at the lower end thereof is set at Dd smaller than Da, as described above. FIG. 12 shows the configuration in this case. As a result, sectional areas of the first and second cross-sectional areas of the first and second buried wirings 10a and 10b can be set so as to be substantially equal to each other, whereupon the first and second buried wirings 10a and 10b can be formed so that the wiring resistances of both buried wirings 10a and 10b are substantially equal to each other. Furthermore, this configuration also prevents the reduction in the insulation resistances between the undersides of the first and second buried wirings 10a and 10b and the respective contact plugs 5. Consequently, the process capacity can be prevented from being reduced.

In the foregoing embodiment, furthermore, the amorphous silicon film 13 is formed so as to have a film thickness smaller than that is employed in the conventional process or the intervals of the facing pairs Pa. Consequently, a desirable buriability can be achieved in the facing pairs Pa in the step of forming the copper layer 9 after the forming of the barrier metal layer 8. Furthermore, since each adjacent pair Aj is rendered wider by about 6 nm as compared with each facing pair Pa, substantially the same buriability as in each facing pair Pa can be obtained in each adjacent pair Pj.

On the other hand, in order that a desirable buriability may be achieved in each adjacent pair Aj, the width of each core pattern 11a can be set so as to be smaller than D2, and the film thickness of the amorphous silicon film 13 serving as the mask-forming film can be set at D2 which is employed in the conventional process. Consequently, the dimension between the mask patterns of the adjacent pair Aj can be set so as to be larger than the dimension between the mask patterns of the facing pair Pa when the silicon oxide film 7 is etched.

In the step of forming the mask patterns 13a, the width of each mask pattern 13a is rendered substantially equal to the film thickness D4 from the lower end to the upper surface thereof. However, an etching condition may be selected so that tapered surfaces are formed. In this case, the etching condition is set so that an inclination angle of the lower portion of each mask pattern 13a is larger than an inclination angle of the tapered surface of the lower portion of each wiring groove pattern 7a.

Although the resist pattern 12 is used as the mask in the forming of the core pattern in the foregoing embodiment, another process may be employed, instead. In the process, an amorphous silicon film is formed on the silicon nitride film 11 so as to serve as a hard mask for forming core patterns. The amorphous silicon film is processed with the resist pattern 12 serving as a mask thereby to be formed into a hard mask, which is then slimmed and used as a mask for forming core patterns.

The foregoing embodiment should not be restrictive but may be modified or expanded as described below. Any mask may be used as each of the insulating film, the core-forming film and the mask-forming film when functioning as a selectively etchable film in the etching process by the RIE method. For example, the silicon oxide film, the silicon nitride film and the amorphous silicon film all used in the foregoing embodiment may be used as the insulating film, the core-forming film and the mask-forming film respectively.

Although the contact plugs 5 are aligned in a row in the foregoing embodiment, the contact plugs may be arranged at intervals of one into a zigzag arrangement, instead.

Although the sidewall transfer technique is applied to the buried wirings 10a and 10b both connected to the contact plugs 5 respectively in the foregoing embodiment, the sidewall transfer technique may be applied to another wiring layer.

The foregoing configuration may be applied to overall semiconductor devices having respective wiring layers which need to be refined or microstructured, including various memory devices such as NOR flash memories, SRAM or RAM other than the NAND flash memory.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A semiconductor device comprising:
   a semiconductor substrate;
   an insulating film formed above the semiconductor substrate; and
   a plurality of first buried wirings and a plurality of second buried wirings provided in the insulating film so that the first and second buried wirings extend in a first direction parallel to a surface of the semiconductor substrate and so that the first and second buried wirings are arranged alternately at predetermined intervals in a second direction that is parallel to the surface of the semiconductor substrate and crosses the first direction, wherein each second buried wiring is formed so that a width between both side surfaces thereof is increased from a lower end thereof toward an upper portion thereof and at an upper surface thereof the width is larger than a width at an upper surface of each first buried wiring.

2. The device according to claim 1, wherein each of the first and second buried wirings is formed by burying a conductive film in a wiring groove pattern with a barrier metal film being interposed therebetween, the wiring groove pattern being formed in the insulating film.

3. The device according to claim 2, wherein the conductive film is a copper film.

4. The device according to claim 2, wherein the barrier metal film is a titanium/titanium nitride (Ti/TiN) film.

5. The device according to claim 1, wherein the first and second buried wirings are provided so that each second buried wiring is positioned between two of the first buried wirings and so that each first buried wiring is positioned between two of the second buried wirings.

6. The device according to claim 1, wherein the insulating film is a silicon oxide film.

7. The device according to claim 6, further comprising an etching stopper film located between the semiconductor substrate and the insulating film, wherein the insulating film is formed on the etching stopper film.

8. The device according to claim 7, wherein the etching stopper film is a silicon nitride film.

9. The device according to claim 1, further comprising a plurality of contact plugs which are formed so as to connect between the insulating film and a surface of the semiconductor substrate, wherein the first and second wirings are connected to the contact plugs respectively.

10. The device according to claim 9, wherein the first and second buried wirings are bit lines disposed adjacent to each other.

11. The device according to claim 1, which is applied to a NAND nonvolatile memory device formed on the semiconductor substrate.

12. The device according to claim 1, further comprising an etching stopper film located between the semiconductor substrate and the insulating film, wherein the insulating film is formed on the etching stopper film.

13. The device according to claim 1, wherein the first buried wirings have respective upper surfaces and the second buried wirings have respective upper surfaces having levels equal to levels of the upper surfaces of the first buried wirings.

* * * * *